United States Patent
Liu et al.

(10) Patent No.: US 8,431,488 B2
(45) Date of Patent: *Apr. 30, 2013

(54) DAMASCENE PROCESS USING CLEANING SOLUTION

(75) Inventors: An-Chi Liu, Tainan (TW); Tien-Cheng Lan, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/293,282

(22) Filed: Nov. 10, 2011

(65) Prior Publication Data

US 2012/0052686 A1     Mar. 1, 2012

Related U.S. Application Data

(63) Continuation of application No. 12/830,566, filed on Jul. 6, 2010, now Pat. No. 8,114,773.

(51) Int. Cl.
    *H01L 21/44*     (2006.01)

(52) U.S. Cl.
    USPC ........... 438/675; 438/623; 438/653; 438/667; 438/692; 438/702; 257/E21.228

(58) Field of Classification Search .................. None
    See application file for complete search history.

(56) References Cited

U.S. PATENT DOCUMENTS

| | | | |
|---|---|---|---|
| 5,972,862 A * | 10/1999 | Torii et al. ............. | 510/175 |
| 6,605,230 B1 | 8/2003 | Liaw et al. | |
| 7,399,365 B2 * | 7/2008 | Aoyama et al. ......... | 134/2 |
| 8,114,773 B2 * | 2/2012 | Liu et al. ............... | 438/675 |
| 2002/0112740 A1 | 8/2002 | DeYoung et al. | |
| 2002/0119672 A1 | 8/2002 | Wu et al. | |
| 2007/0184996 A1 | 8/2007 | Weng et al. | |

* cited by examiner

*Primary Examiner* — Kyoung Lee
(74) *Attorney, Agent, or Firm* — Ding Yu Tan

(57) ABSTRACT

A cleaning solution is provided. The cleaning solution includes a fluorine containing compound, an inorganic acid, a chelating agent containing a carboxylic group and water for balance. The content of the fluorine containing compound is 0.01-0.5 wt % of. The content of the inorganic acid is 1-5 wt %.

11 Claims, 5 Drawing Sheets

DAMASCENE PROCESS USING CLEANING SOLUTION

CROSS-REFERENCE TO RELATED APPLICATION

This is a continuation application of an application Ser. No. 12/830,566, filed Jul. 6, 2010. The entirety of the above-mentioned patent are hereby incorporated by reference herein and made a part of this specification.

FIELD OF THE INVENTION

The present invention relates to a cleaning solution and a damascene process using the same.

BACKGROUND OF THE INVENTION

A Dual damascene process is a technology widely applied in a semiconductor process. To reduce the RC delay caused by a parasitic capacitance, the current dual damascene process adopts an ultra low-k (ULK) material as a dielectric layer. Further, with the minimization of the device, a titanium nitride (TiN) hard mask layer is formed on the dielectric layer, and then the required patterns are precisely transferred to the dielectric layer by utilizing different etching selectivities of the TiN hard mask layer and the dielectric layer.

The pattern transfer is usually achieved by a dry etching process. However, during the etching process, the reactive gases passing into a reaction chamber may also undergo a polymerization reaction. Therefore, the organic polymer formed from the polymerization reaction is deposited on the surface of the device. Moreover, the reactive gases used for etching the dielectric layer are mostly fluorine-containing gases. These fluorine-containing gases may react with the TiN hard mask layer to produce titanium fluoride (TiFx) on the surface of the device, and thus, a profile change of the device, abnormal conduction, leakage or short circuiting between film layers is caused, and the reliability of the device is accordingly reduced.

The effect produced by the polymer and titanium fluoride residues is particularly significant in the deep sub-micro fabrication process. Further, upon the study, the post-etch cleaning process may effect the conduction ability of the device by etching the exposed metal lines below the dual damascene opening, cause a profile change by swelling the dielectric layer with the cleaning solution, or lead to an increase in the dielectric constant. Therefore, the post-etch cleaning process has become a very important step in the duel damascene process.

SUMMARY OF THE INVENTION

The present invention provides a cleaning solution to effectively remove the residues containing a plurality of species.

The present further invention provides a damascene process to reduce the surface damage (copper loss) of the conductive layer, avoid damages of the dielectric layer or an increase in the dielectric constant, or prevent bridges between the dual damascene structures, and thus, the reliability of the semiconductor device is enhanced.

The present invention provides a cleaning solution including a fluorine containing compound, an inorganic acid, a chelating agent containing a carboxylic group and water for balance. The content of the fluorine containing compound is 0.01-0.5 wt % of. The content of the inorganic acid is 1-5 wt %.

According to an embodiment of the present invention, the inorganic acid includes sulfuric acid ($H_2SO_4$) or hydrochloric acid (HCl).

According to an embodiment of the present invention, the chelating agent containing the carboxylic group includes oxalic acid.

According to an embodiment of the present invention, the cleaning solution consists of 0.01-0.5 wt % of the fluorine containing compound; 1-5 wt % of the inorganic acid; the chelating agent containing the carboxylic group; and water for balance.

According to an embodiment of the present invention, the fluorine containing compound includes hydrofluoric acid (HF) and ammonium fluoride ($NH_4F$).

According to an embodiment of the present invention, the cleaning solution further includes ethylenediaminetetraacetic acid (EDTA).

According to an embodiment of the present invention, the cleaning solution further includes triethanolamine (TEA).

The present invention further provides a damascene process. The process includes the following steps. A substrate having a conductive layer thereon is provided. A dielectric layer and a metal hard mask layer is sequentially formed on the substrate. The metal hard mask layer and the dielectric layer are sequentially etched so as to form an opening exposing the conductive layer. A post-etch cleaning process with a cleaning solution performed. The cleaning solution includes 0.01-0.5 wt % of a fluorine containing compound; 1-5 wt % of an inorganic acid; a chelating agent containing a carboxylic group; and water for balance.

According to an embodiment of the present invention, the inorganic acid includes sulfuric acid ($H_2SO_4$) or hydrochloric acid (HCl).

According to an embodiment of the present invention, the chelating agent containing the carboxylic group includes oxalic acid.

According to an embodiment of the present invention, the cleaning solution consists of 0.01-0.5 wt % of the fluorine containing compound; 1-5 wt % of the inorganic acid; the chelating agent containing the carboxylic group; and water for balance.

According to an embodiment of the present invention, the opening includes a dual damascene opening, a via opening or a contact opening.

According to an embodiment of the present invention, the metal hard mask layer includes titanium, titanium nitride, tantalum, tantalum nitride, tungsten, tungsten nitride, or a combination thereof.

According to an embodiment of the present invention, the damascene process further includes the step of forming a buffer layer after forming the dielectric layer and before the step of forming the metal hard mask layer and forming a cap layer after the step of forming the metal hard mask layer, wherein the cap layer includes silicon carbide, silicon nitride or silicon oxynitride.

According to an embodiment of the present invention, the buffer layer includes silicon oxide or silicon oxynitride.

According to an embodiment of the present invention, the fluorine containing compound includes hydrofluoric acid (HF) and ammonium fluoride ($NH_4F$).

According to an embodiment of the present invention, hydrofluoric acid (HF) is 0.01-0.1 wt %.

According to an embodiment of the present invention, ammonium fluoride ($NH_4F$) is 0.05-0.5 wt %.

According to an embodiment of the present invention, cleaning solution further includes ethylenediaminetetraacetic acid (EDTA).

According to an embodiment of the present invention, the cleaning solution further includes triethanolamine (TEA).

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

An embodiment of the present invention provides a cleaning solution. The cleaning solution includes hydrofluoric acid (HF), an inorganic acid, ammonium fluoride ($NH_4F$), a chelating agent containing a carboxylic group, triethanolamine (TEA), ethylenediaminetetraacetic acid (EDTA) and water.

In the cleaning solution, the content of hydrofluoric acid is 0.01-0.1 wt %. The content of the strong acid is 1-5 wt %. The strong acid is an inorganic acid with pKa value less than −1.74, such as sulfuric acid ($H_2SO_4$) or hydrochloric acid (HCl). The content of ammonium fluoride is 0.05-0.5 wt %. The chelating agent containing the carboxylic group includes oxalic acid, for example. The rest of the cleaning solution is water. The water is de-ionized (DI) water. In an embodiment, the cleaning solution consists of hydrofluoric acid, the strong acid, ammonium fluoride, the chelating agent containing the carboxylic group, triethanolamine, ethylenediaminetetraacetic acid and water, and other components are not included.

The cleaning solution can be applied to a damascene process. A dual damascene process is taken as an example in the following.

FIGS. 1A to 1E schematically illustrate cross-sectional views of a damascene process according to an embodiment of the present invention.

Figure 1A:
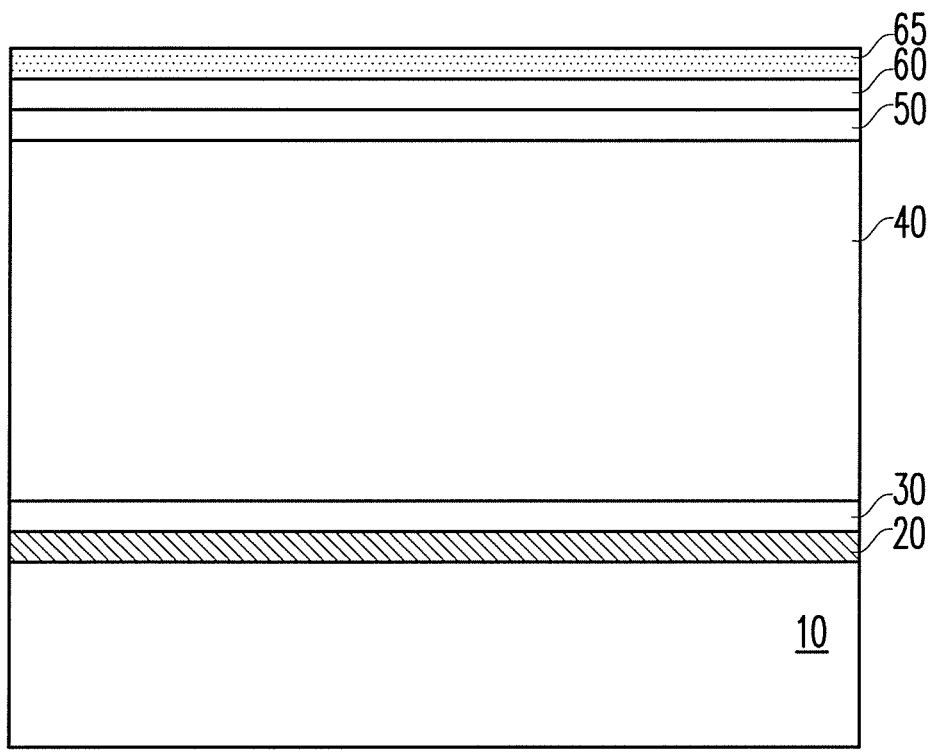
FIGS. 1A to 1E schematically illustrate cross-sectional views of a damascene process according to an embodiment of the present invention.

Referring to FIG. 1A, a substrate 10 having a conductive layer 20 and a cap layer 30 sequentially thereon is provided. The conductive layer 20 includes Cu, CuAl alloy or CuAlSi alloy, for example. The cap layer 30 includes silicon nitride, silicon oxynitirde or silicon carbide, for example. Thereafter, a dielectric layer 40, a buffer layer 50, a metal hard mask layer 60, and a cap layer 65 are sequentially formed on the cap layer 30. The dielectric layer 40 includes an ultra low-k (ULK) material, for example. The ultra low-k material is a material with a dielectric constant of 2.5~2.7 or lower. The ultra low-k material includes Black diamond (Trademark of AMAT), or Dense ULK (Trademark of NOVELLUS) for example. The material of the buffer layer 50 is different from that of the dielectric layer 40. The buffer layer 50 includes silicon oxide or silicon oxynitride, for example. The metal hard mask layer 60 includes metal or metal nitride, such as titanium, titanium nitride, tantalum, tantalum nitride, tungsten, tungsten nitride, or a combination thereof. The cap layer 65 is adapted to protect the metal hard mask layer 60 and includes silicon nitride, silicon oxide, silicon oxynitirde or silicon carbide, for example.

Figure 1B:
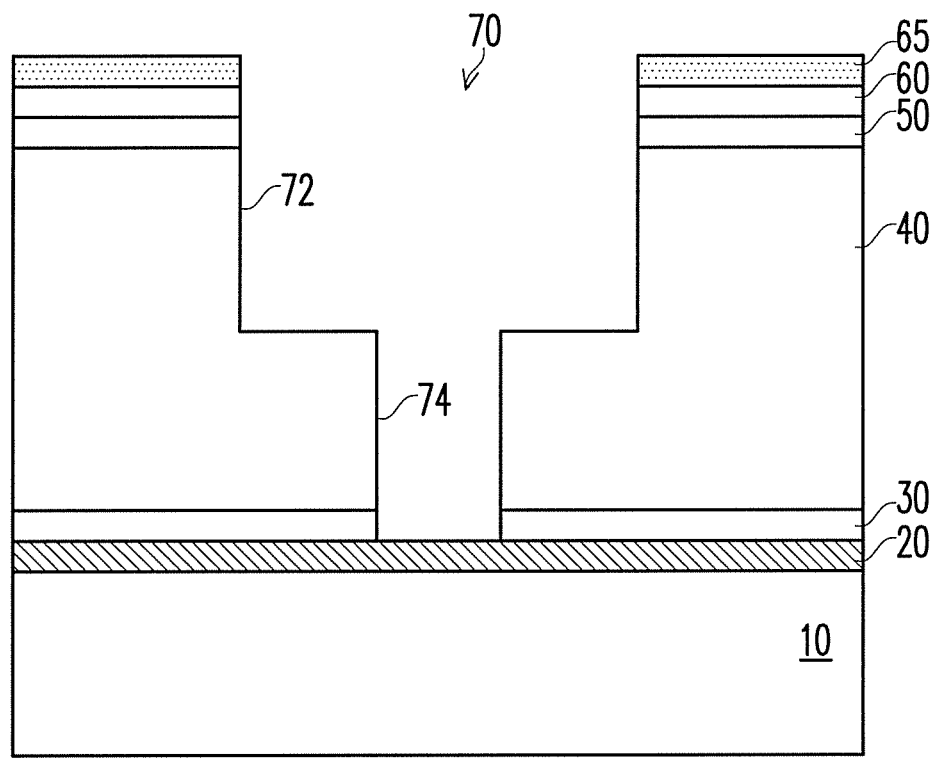

Referring to FIG. 1B, a dual damascene opening 70 is formed in the cap layer 65, the metal hard mask layer 60, the buffer layer 50, the dielectric layer 40 and the cap layer 30 by photolithography and etching processes. The bottom of the dual damascene opening 70 exposes the conductive layer 20. The dual damascene opening 70 is formed by a laterally extending trench 72 disposed at an upper position and a vertically extending via opening 74 disposed at a lower position. The method of forming the dual damascene opening 70 includes forming the via opening 74 prior to the trench 72, or forming the trench 72 prior to the via opening 74. The etching gases for the etching process usually include fluorine, so as to remove the metal such as refractory metal in the metal hard mask layer 60. During the etching process, polymer is usually formed on the sidewall of the dual damascene opening 70. Moreover, in the etching process, the copper loss problem occurs due to the formation of copper oxide ($CuO_x$) or $CuO_xF_y$ on the surface of the conductive layer 20 (e.g. copper layer) exposed by the dual damascene opening 70. Therefore, after the step of forming the dual damascene opening 70, the to-be-removed residual species include refractory metal, fluorine, oxygen, silicon, carbon and copper.

Figure 1C:
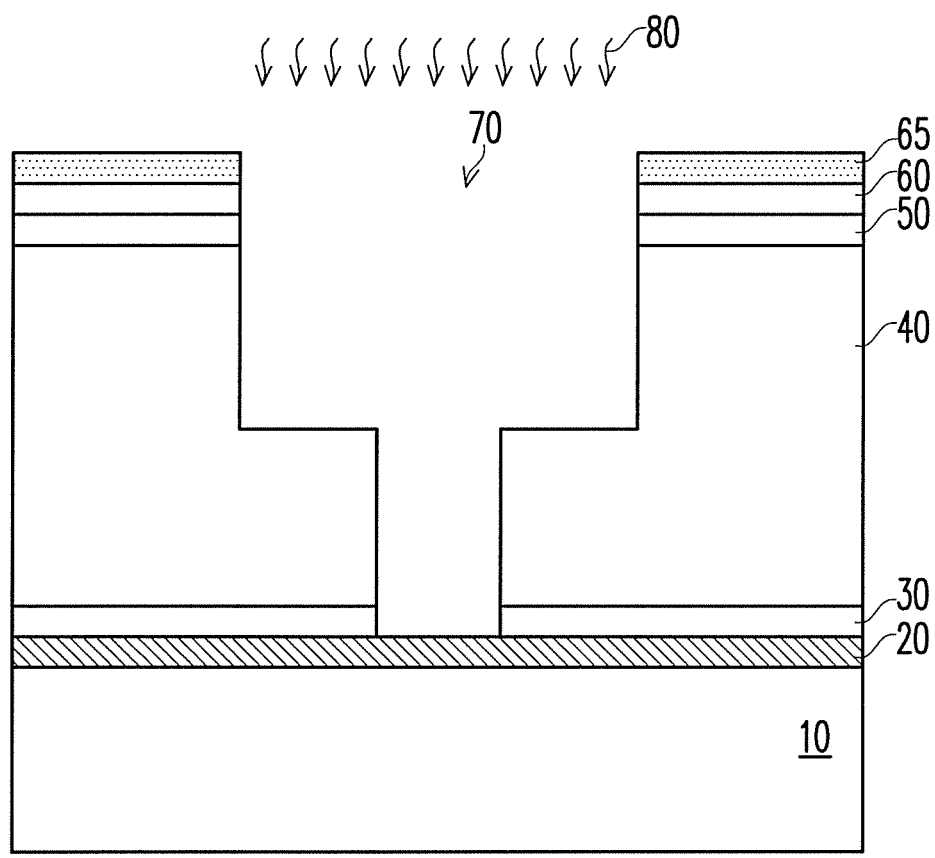

Referring to FIG. 1C, a chemical cleaning process 80 (or a post-etch cleaning process) is performed with the above-mentioned cleaning solution, so as to remove the residues on the substrate 10 as well as the damaged surface of the conductive layer 20. The cleaning solution consists of hydrofluoric acid, the strong acid, ammonium fluoride, the chelating agent containing the carboxylic group, triethanolamine, ethylenediaminetetraacetic acid and water, and other components are not included. The components and contents in the cleaning solution are described above, and the details are not iterated herein. The chemical cleaning process 80 can be performed at room temperature, such as 20 to 50° C., for example. The time period of the chemical cleaning process 80 is 60 to 120 seconds, for example.

Hydrofluoric acid, sulfuric acid and ammonium fluoride in the cleaning solution are configured for providing fluorine ions and adjusting the pH value. The chelating agent containing the carboxylic group, triethanolamine and ethylenediaminetetraacetic acid in the cleaning solution serve as a chelating agent, resolve the metal complexes in the aqueous solution, and stabilize the surface of the conductive layer to avoid re-oxidation of the conductive layer, and thus, they are regarded as a surface oxidation inhibitor.

In details, sulfuric acid in the cleaning solution hardly reacts with the dielectric layer 40, so that damages of the dielectric layer 40 do not occur. However, sulfuric acid can react with $CuO_x$ or $CuO_xF_y$ on the surface of the conductive layer 20 to form water-soluble copper ions ($Cu^{2+}$). The copper ions can chelate with the chelating agent containing the carboxylic group, so as to avoid copper loss caused by re-oxidation of the conductive layer 20. Further, sulfuric acid, hydrofluoric acid and ammonium fluoride in the cleaning solution are mixed to form $SO_3F^-$, which is a strong nucleophilic reagent to make the Cu−R bonds break and achieve the purpose of removing the residues.

Figure 1D:
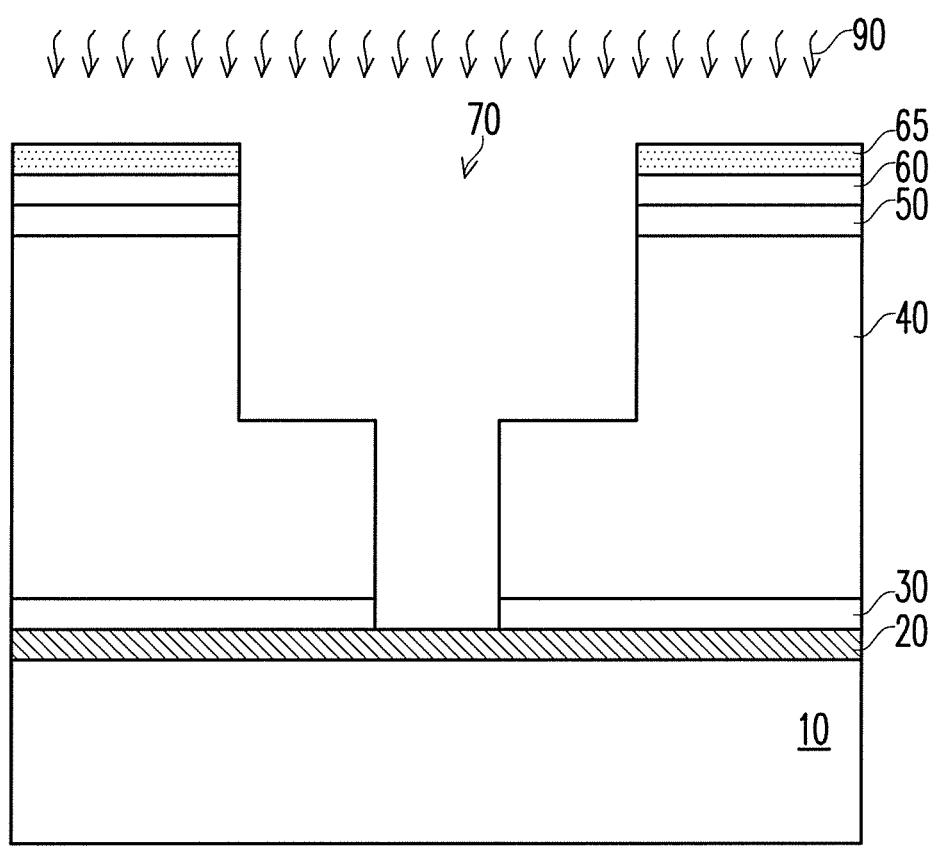

Referring to FIG. 1D, a cleaning process 90 is performed after the step of performing the chemical cleaning process 80. In an embodiment, the cleaning process 90 is performed immediately after the step of performing the chemical cleaning process 80, and no other processes between the cleaning process 90 and the chemical cleaning process 80 are present. The cleaning process 90 is performed with DI water only, and no other components are used. The cleaning process 90 can be performed at room temperature, such as 20 to 30° C., for example. The time period of the cleaning process 90 is 30 to 90 seconds, for example. Thereafter, a baking process is performed. The temperature of the baking process is 200 to 300° C., and the time period of the same is 30 to 60 minutes, for example.

Figure 1E:
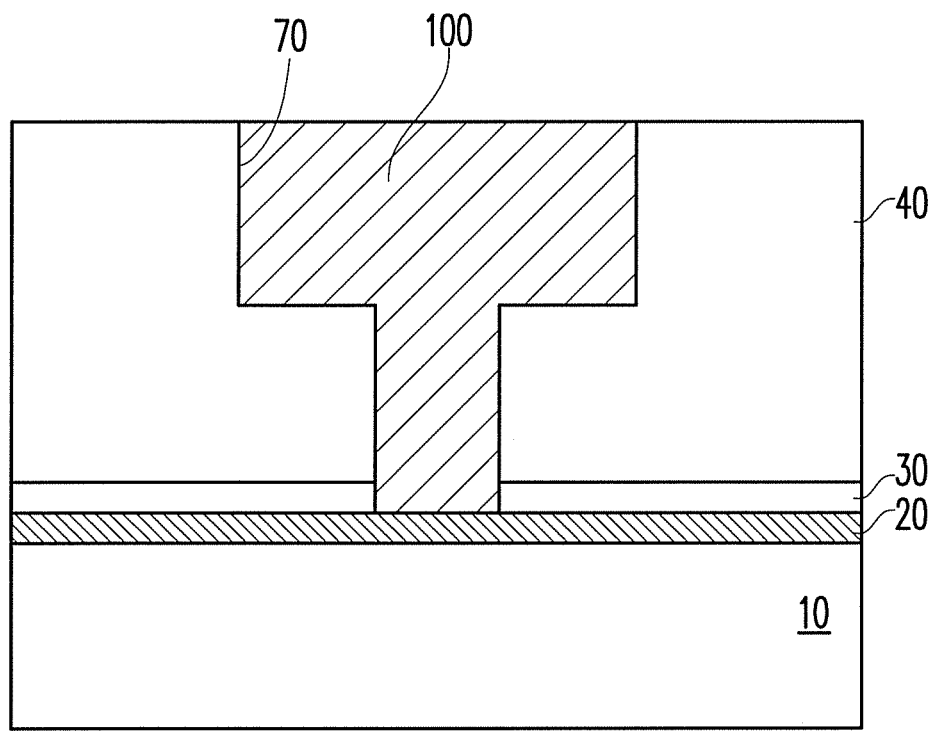

Referring to FIG. 1E, a conductive material (not shown) is formed on the cap layer 65 and the metal hard mask layer 60 filling in the dual damascene opening 70. The conductive material includes copper, for example. Thereafter, a chemical mechanical polishing (CMP) or an etching back process is performed to remove the conductive material on the cap layer 65 and remain the conductive material 100 in the dual damascene opening 70. Afterwards, the cap layer 65, the metal hard mask layer 60, and the buffer layer 50 are removed.

The dual damascene process in the above-mentioned embodiment is provided for illustration purposes, and is not construed as limiting the present invention. The above-mentioned dual damascene opening can also be a via opening or a contact opening only. Therefore, the above-mentioned cleaning solution can be applied to a single damascene process.

Further, the cleaning solution is not limited to apply to a damascene process. The cleaning solution of the present invention can be applied to a semiconductor process with to-be-removed residual species including refractory metal, fluorine, oxygen, silicon, carbon and copper.

EXAMPLE

An ultra low-k dielectric layer, a silicon oxynitride layer and a titanium nitride layer are sequentially formed on a substrate having a copper layer and a carbide silicon nitride layer thereon. Thereafter, a photolithography process is performed and followed by a dry etching process with fluorine containing gases, so as to form a dual damascene opening. Afterwards, a chemical cleaning process is performed with a cleaning solution (0.06 wt % of hydrofluoric acid, 3 wt % of sulfuric acid, 0.1 wt % of ammonia fluoride, 10 wt % of oxalic acid, 10 wt % of TEA, 0.2 wt % of EDTA and water for balance), and then another cleaning process is performed immediately with DI water.

The result shows that the residues in the process can be effectively removed by performing the chemical cleaning process with the cleaning solution and followed by another cleaning process with DI water. Moreover, damages are not found on the surface of the dielectric layer or the copper layer, or an increase in the dielectric constant is not caused. Bridges are not observed between the formed dual damascene structures. Thus, the reliability of the semiconductor device can be accordingly enhanced.

Comparative Examples 1 to 6

A dual damascene opening is formed by the method of the above-mentioned Example. Thereafter, a post-etch cleaning process is performed with different cleaning solutions including different components, and immediately followed by another cleaning process with DI water. The results are shown in Table 1.

TABLE 1

| | Components of cleaning solution | Results |
| --- | --- | --- |
| Comparative example 1 | 10 wt % of oxalic acid, 0.1 wt % of ammonia fluoride, 3 wt % of sulfuric acid, 0.06 wt % of hydrofluoric acid and water for balance | Copper surface damage |
| Comparative example 2 | 10 wt % citric acid, 0.1 wt % of ammonia fluoride, 3 wt % of sulfuric acid, 0.06 wt % of hydrofluoric acid and water for balance | Polymer residue |
| Comparative example 3 | 5 wt % of iminodiacetic acid (IDA), 0.1 wt % of ammonia fluoride, 3 wt % of sulfuric acid, 0.06 wt % of hydrofluoric acid and water for balance | Polymer residue Dielectric layer damage |
| Comparative example 4 | 10 wt % of oxalic acid, 0.2 wt % of EDTA, 3 wt % of sulfuric acid, 0.06 wt % of hydrofluoric acid and water for balance | Copper surface damage Polymer residue |
| Comparative example 5 | 10 wt % of TEA, 0.1 wt % of ammonia fluoride, 3 wt % of sulfuric acid, 0.06 wt % of hydrofluoric acid and water for balance | Copper surface damage |
| Comparative example 6 | 5 wt % of iminodiacetic acid, 1 wt % of $NH_4HF_2$, 3 wt % of sulfuric acid, 0.06 wt % of hydrofluoric acid and water for balance | Dielectric layer damage Copper surface damage |

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A damascene process, comprising:
   providing a substrate having a conductive layer thereon;
   sequentially forming a dielectric layer and a metal hard mask layer on the substrate;
   sequentially etching the metal hard mask layer and the dielectric layer, so as to form an opening exposing the conductive layer; and
   performing a post-etch cleaning process with a cleaning solution, wherein the cleaning solution comprises:
   (a) 0.01-0.5 wt % of a fluorine containing compound;
   (b) 1-5 wt % of an inorganic acid;
   (c) a chelating agent containing a carboxylic group;
   (d) water for balance; and
   (e) ethylenediaminetetraacetic acid (EDTA).

2. The damascene process of claim 1, wherein the inorganic acid comprises sulfuric acid ($H_2SO_4$) or hydrochloric acid (HCl).

3. The damascene process of claim 1, wherein the chelating agent comprises oxalic acid.

4. The damascene process of claim 1, wherein the opening comprises a dual damascene opening, a via opening or a contact opening.

5. The damascene process of claim 1, wherein the metal hard mask layer comprises titanium, titanium nitride, tantalum, tantalum nitride, tungsten, tungsten nitride, or a combination thereof.

6. The damascene process of claim 1, further comprising forming a buffer layer after the steps of forming the dielectric layer and before the step of forming the metal hard mask layer and forming a cap layer after the step of forming the metal hard mask layer, wherein the cap layer comprises silicon carbide, silicon nitride or silicon oxynitride.

7. The damascene process of claim 6, wherein the buffer layer comprises silicon oxide or silicon oxynitride.

8. The damascene process of claim 1, wherein the fluorine containing compound comprises hydrofluoric acid (HF) and ammonium fluoride (NH$_4$F).

9. The damascene process of claim 8, wherein the hydrofluoric acid (HF) is 0.01-0.1 wt %.

10. The damascene process of claim 8, wherein the ammonium fluoride (NH$_4$F) is 0.05-0.5 wt %.

11. The damascene process of claim 1, wherein the cleaning solution further comprises (f) triethanolamine (TEA).

* * * * *